(12) United States Patent
Cheung

(10) Patent No.: US 6,856,510 B2
(45) Date of Patent: Feb. 15, 2005

(54) EFFICIENT COOLER

(75) Inventor: Wai Kwan Cheung, Hong Kong (HK)

(73) Assignee: Chi Mei Chang (HK)

( * ) Notice: Subject to any disclaimer, the term of this patent is extended or adjusted under 35 U.S.C. 154(b) by 299 days.

(21) Appl. No.: 09/938,092

(22) Filed: Aug. 23, 2001

(65) Prior Publication Data
US 2002/0135961 A1 Sep. 26, 2002

(30) Foreign Application Priority Data

Mar. 26, 2001 (CN) .......................................... 01107666 A

(51) Int. Cl.$^7$ ............................. H05K 7/20; F23L 15/02
(52) U.S. Cl. ....................... 361/696; 361/698; 165/80.4
(58) Field of Search ................................. 361/692–699, 361/701–709, 103, 608, 700, 689; 165/80.2, 80.3, 80.4

(56) References Cited

U.S. PATENT DOCUMENTS 5,390,077 A    2/1995  Paterson ..................... 361/700
5,529,115 A    6/1996  Paterson ..................... 165/104
5,829,516 A  * 11/1998  Lavochkin .................. 165/80.4
6,522,930 B1 *  2/2003  Schaer et al. ............... 607/101

FOREIGN PATENT DOCUMENTS

GB            2349985      11/2000  .................... 7/20

* cited by examiner

Primary Examiner—Brian Sircus
Assistant Examiner—Danny Nguyen
(74) Attorney, Agent, or Firm—Ostrolenk, Faber, Gerb & Soffen, LLP

(57) ABSTRACT

A high efficiency heat sink comprising a U-shaped copper tube and a press-formed sealed vacuum vessel formed of pure copper sheet. The sealed vacuum vessel contains fibers that are strongly absorbent and are impregnated with a refrigerant. The thermal energy effect of the surface with which the inhibited glycol refrigerant employed by the present invention is in contact causes the glycol to vaporize and ascend into the orifice of the U-shaped copper tube. A fan causes the orifice of the U-shaped copper tube of the evaporator to cool and condenses the vapor to liquid, and the liquid flows back again into the sealed vacuum vessel, thus forming a cyclic type heat exchanger and achieving the optimum heat dispersal effect.

8 Claims, 4 Drawing Sheets

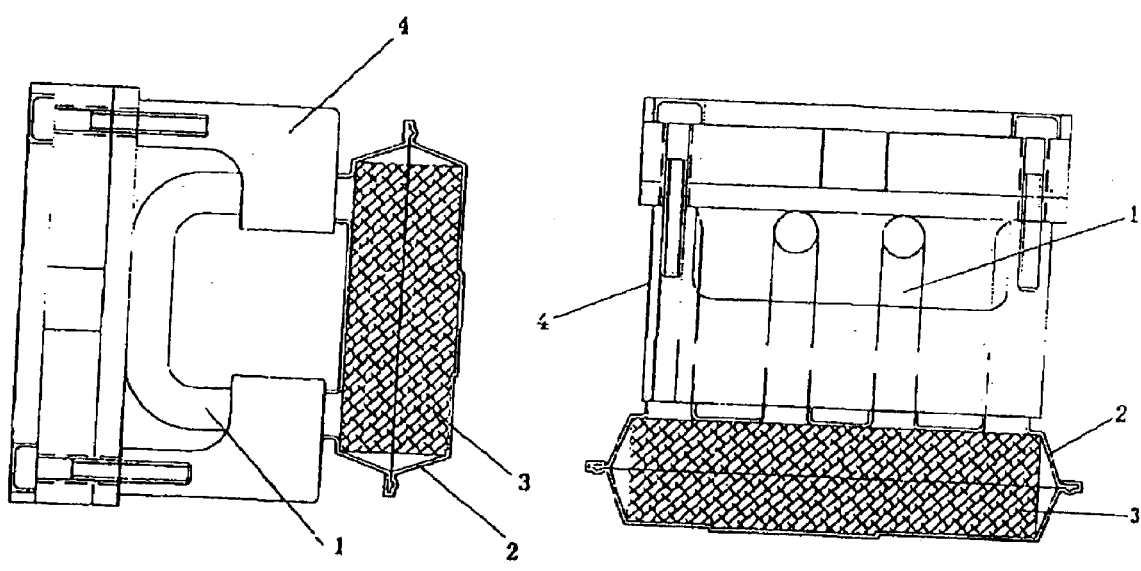

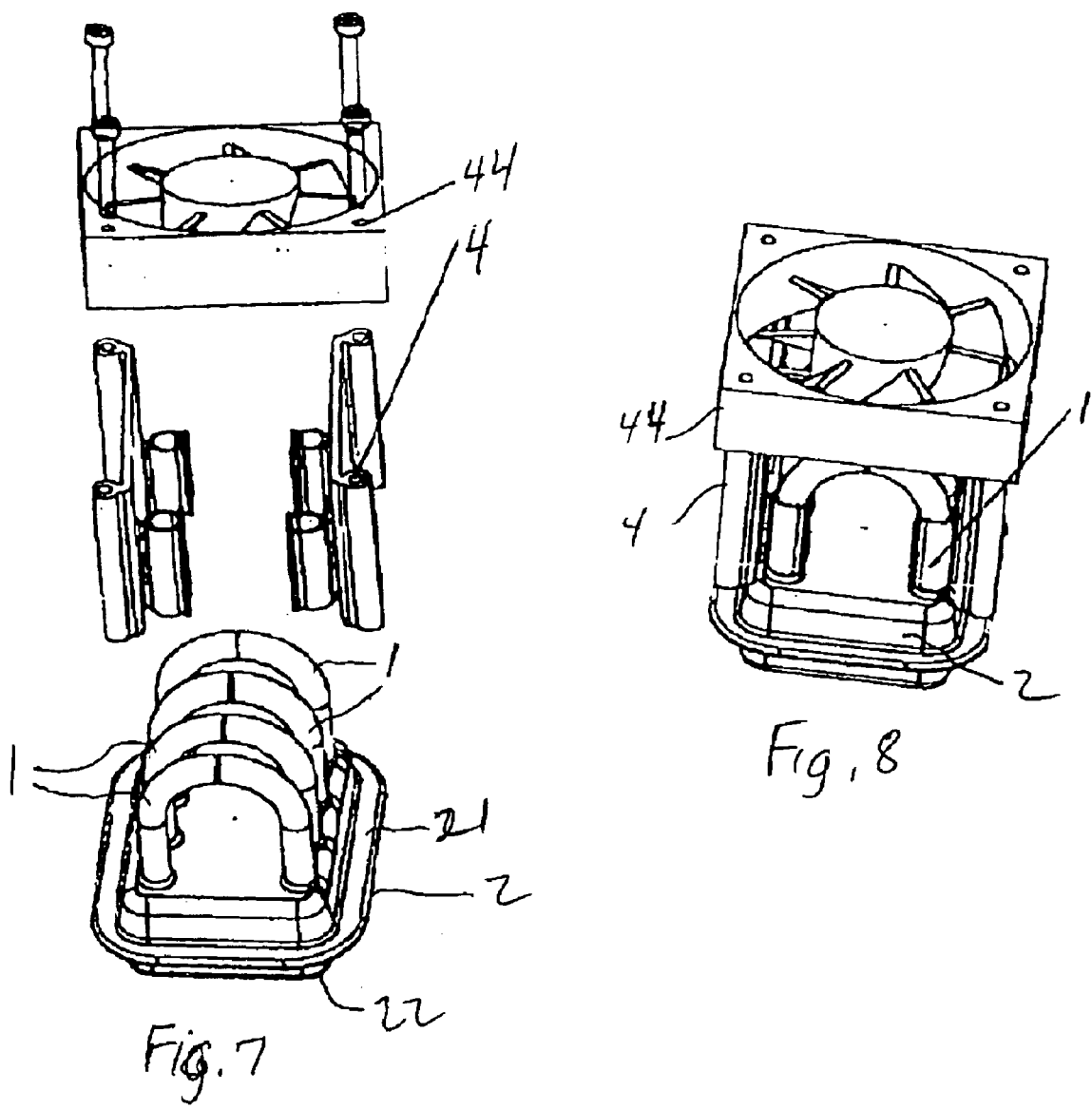

EFFICIENT COOLER

BACKGROUND OF THE INVENTION

The present invention relates to a high efficiency heat sink and, more particularly, relates to a heat sink that is employed in electronic equipment.

Aluminum alloy heat sinks have been commonly employed in electronic equipment. But, such heat sinks are unable to fully meet the demands of modern high performance electronic equipment for the dispersal of heat, for example, the heat generated from computer central processing units (CPUs) whose speed continues to increase and from high performance frequency converters for alternating current-direct current electrical equipment in electronic devices. These uniformly demand high performance heat sink devices. Moreover, it has been necessary to accept the effects of the performance of indented heat sinks which are manufactured of aluminum alloy. At the same time, the cost of heat sinks manufactured of pure copper sheet has been high and their mass has been great, which has placed limits on their use in electronic equipment in which space, mass and cost have been restricted.

SUMMARY OF THE INVENTION

It is an object of the present invention to address the above problems, and to provide a high efficiency heat sink capable of meeting the requirements of electronic devices for highly efficient dispersal of heat, and which is also compact and light in mass.

The present invention comprises at least one and preferably a plurality of U-shaped copper tubes, a sealed vessel that is connected to the tubes, and fibers in the vessel that are strongly absorbent and are impregnated with a refrigerant liquid. The upper end of the sealed vessel has an orifice. The orifice of the U-shaped tube is welded and fixed to the orifice of the sealed vessel. The fibers that are strongly absorbent and are impregnated with a refrigerant liquid are disposed within the sealed vessel.

The heat sink also has an externally mounted cooling fan. The fan is attached to a supporting frame that is attached to one side of the U-shaped copper tube. The purpose of the fan is to cool the vaporized liquid inside the U-shaped copper tube, and to cause it to return into the sealed vessel for re-use.

The sealed vessel is comprised of two half-casings, an upper half-casing and a lower half-casing. The lower half casing has a projecting level surface in its base to provide good contact with the heat emitting interposed surface and to amplify the heating and heat conduction effects. The upper half casing has a projecting orifice which is welded to and fixed to the orifice of the U-shaped copper tube.

A vacuum is formed by mechanical means inside the upper and lower half-casings of the vessel, whereupon the vessel is sealed with a silicone gel sealing ring in order to form a vacuum vessel.

The sealed vessel is manufactured of unoxidized pure copper sheet. That vessel contains fibers that are strongly absorbent and are impregnated with a refrigerant liquid.

An inhibited glycol solution is employed as the refrigerant liquid impregnates which the fibers that are strongly absorbent.

The inner hollow passage of each U-shaped copper tube forms an evaporator. The passage of the heat causes vaporized fluid to accumulate in the orifice in the U-shaped copper tube. The fluid is then subjected to cooling and condensation caused by the fan blowing on the outside of the tube and the vapor is again liquefied and is then reused for cooling. This achieves a highly efficient heat sink effect.

Other features and advantages of the present invention will become apparent from the following description of the invention which refers to the accompanying drawings.

BRIEF DESCRIPTION OF THE DRAWINGS

FIG. 1 is a schematic view of a heat sink of the present invention.

FIG. 2 is a view of FIG. 1 around two axes.

FIG. 7 is an exploded perspective view of a heat sink with a fan.

FIG. 8 is an assembled view.

DETAILED DESCRIPTION OF EMBODIMENTS OF THE INVENTION

FIGS. 1 and 2 show that the present invention is comprised of at least one U-shaped copper tube 1, which communicates into a sealed vessel 2. Four such tubes can be seen in FIG. 2. Fibers 3 in the vessel are strongly absorbent and are impregnated with a refrigerant.

Figure 3:
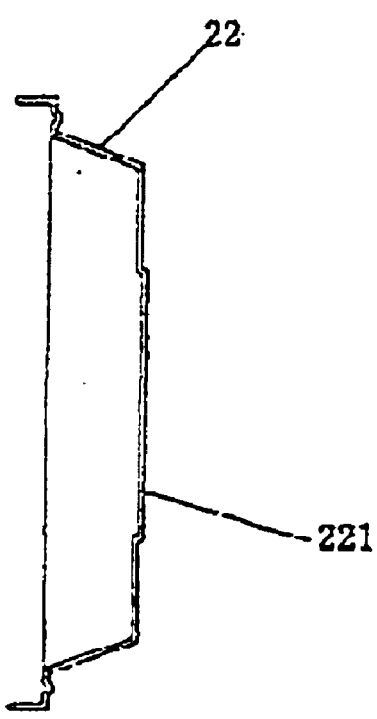
FIG. 3 is a schematic view of the lower half-casing of the sealed vessel.
Figure 4:
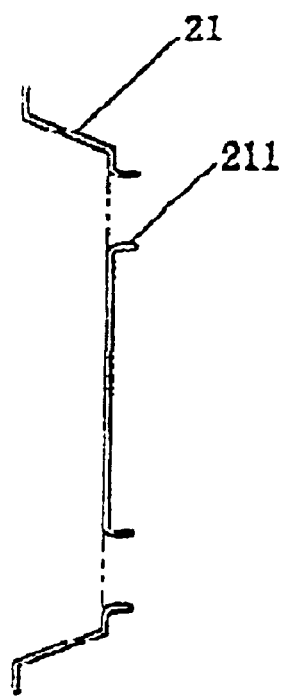
FIG. 4 is a schematic view of the upper half-casing of the sealed vessel.

FIG. 3 and FIG. 4 show that the sealed vessel 2 is comprised of an upper half-casing 21 and a lower half-casing 22 that are shaped so that they together form a casing and that are formed by die stamping.

The lower half-casing 22 has a projecting level surface 221 that projects downwards approximately 5 mm. The length and width of the projecting level surface 221 approximately matches the size of the contact surface of a heat emitting body (not shown) against which the surface is disposed, to ensure optimum contact between the projecting level surface 221 and the surface of the heat emitting body, in order to amplify the effects of the dispersal and conduction of heat.

The upper half-casing 21 includes a plurality of stamped outwardly projecting orifices 211. Those projecting orifices are of the same size as cooperating orifices in the U-shaped copper tube 1 which are received in the orifices in the casing.

Figure 5:
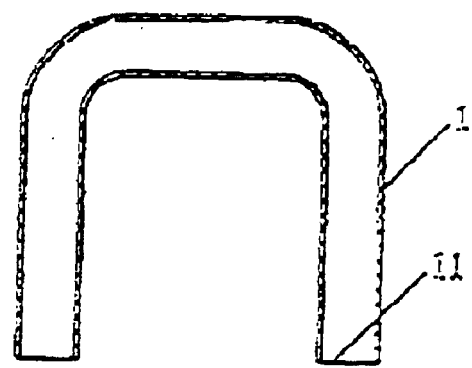
FIG. 5 is a schematic view of the U-shaped copper tube.

FIG. 5 shows that a U-shaped copper tube 1 that may be formed by die bending a straight, unoxidized, pure copper tube in such that the length of the passage of the tube is sufficient to admit and condense vapor. The proportion of the height of the U-shaped copper tube is not less than twice the height of the sealed vessel 2. The U-shaped copper tube 1 is fixed to the corresponding projecting orifices 211 of the upper casing 21 of the sealed vessel 2.

The fibers 3 are strongly absorbent and are impregnated with inhibited glycol as a heat conducting fluid. The fibers 3 are disposed in the interior space of the sealed vessel 2, as seen in FIGS. 1 and 2. A vacuum is induced mechanically in the upper and lower half-casings 21 and 22 of the sealed vessel 2 whereupon a silicone gel sealing ring is employed between the peripheries of the half-casings to form a sealed vacuum vessel.

The outer casing of the heat sink may be nickel electroplated in order to increase the surface heat conductivity of the device.

Figure 6:
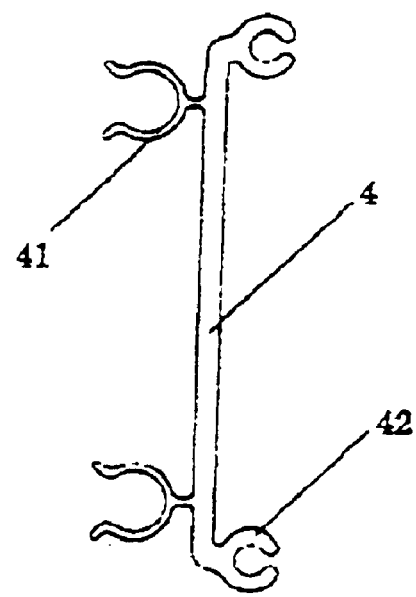
FIG. 6 is a schematic view of the frame for fixing the fan.

As seen in FIG. 6, the ends of the supporting frame 4 for fixing the cooling fan form self-locking U-clips mechanisms 41 for the copper tube in order to fix the frame in a self-locking manner to the U-shaped copper tube 1, and a cooling fan 44 is fixed to the supporting frame 4 at the locking positions 42.

The inhibited glycol heat conductor employed by the present invention may be a special proprietary inhibitor compounds Dowterm or Dowfrost (Trademarks), which perform the special functions of heat conduction and cooling in closed-loop liquid-based HVAC processes, protecting metal surfaces against oxidation, and also providing corrosion resistance.

The inhibited glycol liquid is in fact a water and inhibited glycol solution, and the level of glycol in the liquid can directly affect the performance and characteristics of the liquid. Normally, when such a liquid is employed in electronic equipment, the appropriate temperature cannot exceed 60° C., the optimum level of glycol is within the range 35% to 40% and the optimum level of water is within the range 60% to 65%. For this reason, if the temperature of the liquid inside the sealed vacuum vessel 2 envisaged by the present invention is 60° C. or more, the refrigerant produces small amounts of vapor that commence to ascend the inner orifice of the U-shaped copper tube 1. Under normal operating conditions, the cooling fan 44 that is mounted on the conventional cooling fan supporting frame 4 on the side of the U-shaped copper tube 1 cools the top and surfaces of the U-shaped copper tube 1 and causes the vapor that is ascending inside the U-shaped copper tube 1 to cool and condense into droplets of liquid. When a certain amount of such liquid droplets have accumulated, gravity then causes the liquid droplets to flow back into the inner space of the sealed vessel 2 in which the fibers 3 that are strongly absorbent for liquid are present. Such principle of the inexhaustible return of the heat exchange cycle vapor within the sealed vacuum vessel provides the excellent heat dispersal effects of the present invention. Moreover, the use of punched pure unoxidized copper sheet for such heat sink, and the nickel plating of the outer casing of the heat sink, provides a protective surface that resists oxidation, and is capable of providing a material with excellent heat conducting properties.

Moreover, by providing a greater number of U-shaped copper tubes 1, it is possible to increase the heat exchanging surface area and improve the cooling effect. The number of U-shaped copper tubes 1 may be set according to the heat exchanging surface area that is required.

Although the present invention has been described in relation to a particular embodiment thereof, many other variations and modifications and other uses will become apparent to those skilled in the art. It is preferred, therefore, that the present invention be limited not by the specific disclosure herein, but only by the appended claims.

What is claimed is:

1. A high efficiency heat sink comprising:
   at least one U-shaped copper tube with open ends;
   a sealed vacuum vessel, with orifices into the vessel communicating with the open ends of the copper tubes;
   fibers which are strongly absorbent and are impregnated with a refrigerant liquid and disposed in the vessel;
   an externally mounted cooling fan aimed at the at least one copper tube for moving air over the copper tube; and
   a supporting frame for attachment to the at least one copper tube, the supporting frame including self-locking U-clips that clamp to the at least one copper tube to fix the frame in position, and the fan being supported on the frame.

2. The heat sink of claim 1, wherein the vessel has an upper end region and the orifices communicating with the u-shaped copper tube in the upper end region of the vessel.

3. The heat sink of claim 1, wherein the vacuum vessel includes an upper half casing and a lower half casing which are secured together.

4. The heat sink of claim 3, wherein the lower half casing includes a projecting level surface for communicating with an object for heat transfer.

5. The heat sink of claim 4, wherein the upper half casing includes orifices for the open ends of the copper tube.

6. The heat sink of claim 3, further comprising a sealing ring for sealing the upper and lower casing halves together.

7. The heat sink of claim 6, wherein the sealing ring is comprised of a silicone gel which seals the vessel when the upper and lower half casing are compressed together.

8. The heat sink of claim 1, wherein the fibers are absorbed with an inhibited glycol in the refrigerant liquid.

* * * * *